United States Patent
Perugupalli et al.

(12) 
(10) Patent No.: US 6,448,616 B1
(45) Date of Patent: Sep. 10, 2002

(54) ADAPTIVE BIASING OF RF POWER TRANSISTORS

(75) Inventors: Prasanth Perugupalli, Tempe, AZ (US); Gary Lopes, Palos Verdes, CA (US)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/929,898

(22) Filed: Aug. 14, 2001

(51) Int. Cl.[7] .................. H01L 29/76; H01L 29/94; H01L 31/062; H01L 31/113; H01L 31/119
(52) U.S. Cl. .................. 257/379; 257/536
(58) Field of Search .................. 257/341, 365, 257/379, 380, 536

(56) References Cited

U.S. PATENT DOCUMENTS 4,901,127 A * 2/1990 Chow et al.
4,912,534 A * 3/1990 Tanaka et al.
6,249,029 B1 * 6/2001 Bryant et al. ............... 257/351

* cited by examiner

*Primary Examiner*—Ngân V. Ngô
(74) *Attorney, Agent, or Firm*—Lyon & Lyon LLP

(57) ABSTRACT

A power transistor according to one embodiment of the invention includes a plurality of transistor elements located on a single semiconductor die, each transistor element comprising one or more transistors coupled to a common gate terminal for the respective transistor element. A resistor network couples the transistor element gate terminals between a bias voltage and a reference ground, with resistors in the network sized such that such that a first transistor element is biased in a first, e.g., class A, operating condition, and a second transistor element is biased in a second, e.g., class AB operating condition.

14 Claims, 3 Drawing Sheets

ADAPTIVE BIASING OF RF POWER TRANSISTORS

BACKGROUND OF THE INVENTION

The invention relates generally to radio frequency (RF) power transistors and, more particularly, to circuits and methods for biasing such circuits.

The use of RF power transistor devices as signal amplifiers in wireless communication applications is well known. With the considerable recent growth in the demand for wireless services, such as personal communication services, the operating frequency of wireless networks has increased dramatically and is now well into the gigahertz frequencies. RF power transistors are commonly used in amplification stages for radio base station amplifiers. Such transistors are also widely used in other RF-related applications, such as cellular telephones, paging systems, navigation systems,- television, avionics, and military applications.

Existing wireless communications systems use modulation schemes that require the power amplifier to operate at peak power levels for extremely short duration. For example, in a third generation W-CDMA cellular system, the ratio of signal peak to average is about 8 dB (decibels), which means that the peak power delivered to the amplifier is about 8 dB higher than the average power delivered. The cumulative composite distribution function (CCDF) shows that the probability of occurrence of the peak amplitude of output signal is less than 0.01%.

The RF power transistors used to build these amplifiers are selected to be capable of handling the peak output power as the amplifier requires so they do not run into deep saturation and thereby cause highly non-linear distortion in the signal path when the peaks occur. Preferred transistors for such high frequency applications include laterally diffused metal oxide semiconductor (LDMOS) transistors. Notably, the transistors need to be operated in a low bias condition (i.e., class B and lower) for achieving the optimum drain efficiency, but in a high bias condition (i.e., closer to class A) for best linearity. Thus, power transistors used in RF amplifiers are typically biased under class AB condition, since that presents a trade-off between linearity and drain efficiency. However, this approach of choosing a transistor with a large gate periphery (greater peak power capability) to accommodate the occasional peaks in the modulating signal causes the amplifier system to be inefficient.

A previous solution to address this issue was the Doherty amplifier. A Doherty amplifier uses multiple amplifier circuits combined to achieve a high power system. These amplifiers are built with transistors that are biased differently to achieve higher efficiency in a power amplifier system. However, this causes difficulties in manufacturing due to banding of multiple packages. Additionally, the characteristics can be different for the individual transistors and hence can cause problems during power splitting and combining operations. Further, different matching elements need to be designed for each of the transistors, making the amplifier system bulky and cumbersome.

SUMMARY OF THE INVENTION

In accordance with a first embodiment of the invention, a power transistor circuit for use in a RF amplifier package comprises a single power transistor formed by a plurality of transistor elements, each transistor element having a separate input terminal. A resistor network is adapted for coupling the respective transistor element input terminals between a bias voltage and a reference ground. The resistor network includes a plurality of resistors located in a conductive "bias path" coupling the bias voltage to the reference ground, with the individual transistor element inputs connected to the bias path at different locations. In particular, the resistive elements are interposed in the bias path between connection points of successive transistor element input terminals, such that the input terminals "see" a different dividing resistor network value due to the different cumulative resistance values at the respective connection points on the bias path. In one embodiment, the resistance values are selected such that a first transistor element is biased in a first (e.g., class A) operating condition, and a second transistor element is biased in a second (e.g., class AB) operating condition.

In one embodiment, first and second transistor elements of the power transistor are located on a single semiconductor substrate, and a resistive element connecting respective input terminals of the first and second transistor elements comprises a continuous resistive path disposed on the substrate.

In another embodiment, a first transistor element is located on a first semiconductor substrate, a second transistor element is located on a second semiconductor substrate, and a resistive element connecting respective input terminals of the first and second transistor elements comprises a conductor (e.g., a wire) extending between the first and second substrates.

In accordance with another aspect of the invention, a RF power package includes a single power transistor formed from a first set of one or more transistor elements located on a first die, the first set of transistor elements coupled to a first input terminal, and a second set of one or more transistor elements is located on a second die, the second set of transistor elements coupled to a second input terminal. A resistor network couples the first and second input terminals between a bias voltage terminal and a reference ground terminal. The resistor network includes a plurality of resistors located along a conductive bias path coupling the bias voltage terminal to the reference ground terminal, with the first and second input terminals connected to the bias path at different locations. Respective resistive elements interposed along the bias path between the connection points of the first and second input terminals are sized such that the first set of transistor elements is biased in a first (e.g., class A) operating condition, and the second set of transistor elements is biased in a second (e.g., class AB) operating condition.

In accordance with still another aspect of the invention, a method of biasing a power transistor is provided, the power transistor comprising a plurality of transistor elements. In one embodiment, the method includes biasing a first transistor element in a first (e.g., class A) operating condition, and biasing a second transistor element in a second (e.g., class AB) operating condition.

Other aspects and features of the present invention will become apparent from consideration of the following description taken in conjunction with the accompanying drawings.

BRIEF DESCRIPTION OF THE DRAWINGS

Preferred embodiments are illustrated by way of example, and not by way of limitation, in the figures of the accompanying drawings, in which.

DETAILED DESCRIPTION OF THE PREFERRED EMBODIMENTS

Figure 1:
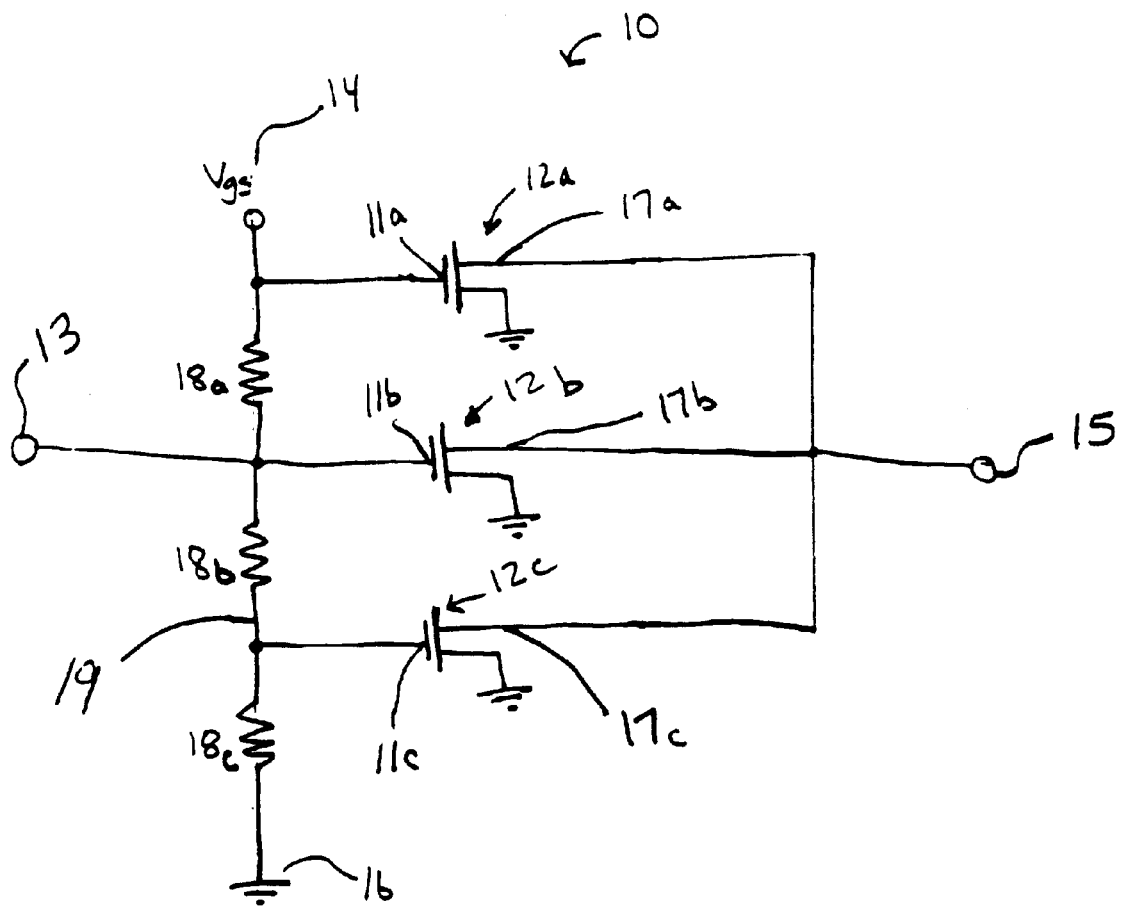
FIG. 1 is a schematic circuit diagram of a power transistor circuit, according to one embodiment of the invention.

FIG. 1 shows a schematic view of a power transistor 10, according to one embodiment of the invention. The power transistor 10, which is configured for incorporation in a RF power amplifier, includes a plurality of active transistor elements 12a–c, the transistor elements having respective gate terminals 11a–c and drain terminals 17a–c. The transistor element gate terminals 11a–c are connected to a common input ("common gate") terminal 13, and the transistor element drain terminals 17a–c are connected to a common output ("common drain") terminal 15. Notably, the respective transistor element gate and drain terminals 11a–c and 17a–c may also be said to be "common" terminals, as the individual transistor elements may each comprise multiple individual transistors.

The input gate terminals 11a–c of the transistor elements 12a–c are biased between a voltage source ($V_{gs}$) 14 and a reference ground 16. In particular, biasing the transistor elements 12a–c is accomplished by integrating differing resistor divider networks at a respective connection point for each transistor element gate terminal along a common gate bias path 19 between the voltage source 14 and the reference ground 16. Selection of the resistance value for each of the resistive elements 18a–c is determined according to the design requirements for biasing the particular transistor element(s) 12a–c and the power transistor 10. In particular, the resistive elements 18a–c are interposed along the bias path 19 between connection points of successive transistor element gate terminals 11a–c, such that each of the gate terminals "sees" a different dividing resistor biasing network, i.e., due to the differing cumulative resistance values at the respective connection points on the bias path 19. In accordance with this aspect of the invention, the transistor elements 12a–c have a progressive reduced bias so that a portion of the power transistor 10, e.g., transistor element 12a, or transistor elements 12a and 12b, can operate in a first operating condition for most of the signal duration. Depending on conditions under which the transistor 10 operates, a rising amplitude of an input signal can cause the other transistor elements 12, e.g., transistor element(s) 12b and/or 12c, to turn ON, so that the entire transistor circuit 10 by itself will not be highly saturated. By way of non-limiting example, by selecting appropriate values for each of the resistive elements 18a–c, the layout of the transistor can be designed such that one third of the transistor 10 operates in class A condition, one third in class AB condition, and another third in class B condition. This configuration provides an optimal trade-off between the highly linear but inefficient operation of class A condition and the highly efficient but non-linear operation of class B condition.

It will be appreciated that the particular number of transistor elements 12a–c is illustrated by way of example and not limitation. It will also be appreciated that the actual number of individual transistors in each of the transistor elements 12a–c may vary from embodiment to embodiment. Further, the transistor elements 12a–c may be fabricated on the same, or separate semiconductor substrates, or some combination thereof. For example, one of the resistive elements, e.g., element 18a, may comprise a doped region in a semiconductor substrate having two of the transistor elements 12a and 12b fabricated thereon. Another one of the resistive elements, e.g., element 18b may comprise a metal layer or wire conductor extending between adjacent, but separate semiconductor substrates containing respective transistor elements 12b and 12c. Thus, the general inventive concept of employing a common bias path with resistive elements interposed between respective transistor element gate connections for adaptive biasing of the individual transistor elements is not to be limited to the particular illustrated embodiments herein.

Also, although one particular type of transistor element (MOSFET) is shown in the schematic, it will be appreciated that many other types of active transistor devices may be used with the biasing scheme of the present invention, e.g., bipolar junction, CMOS, MOSFET, LDMOS, etc.

Figure 2:
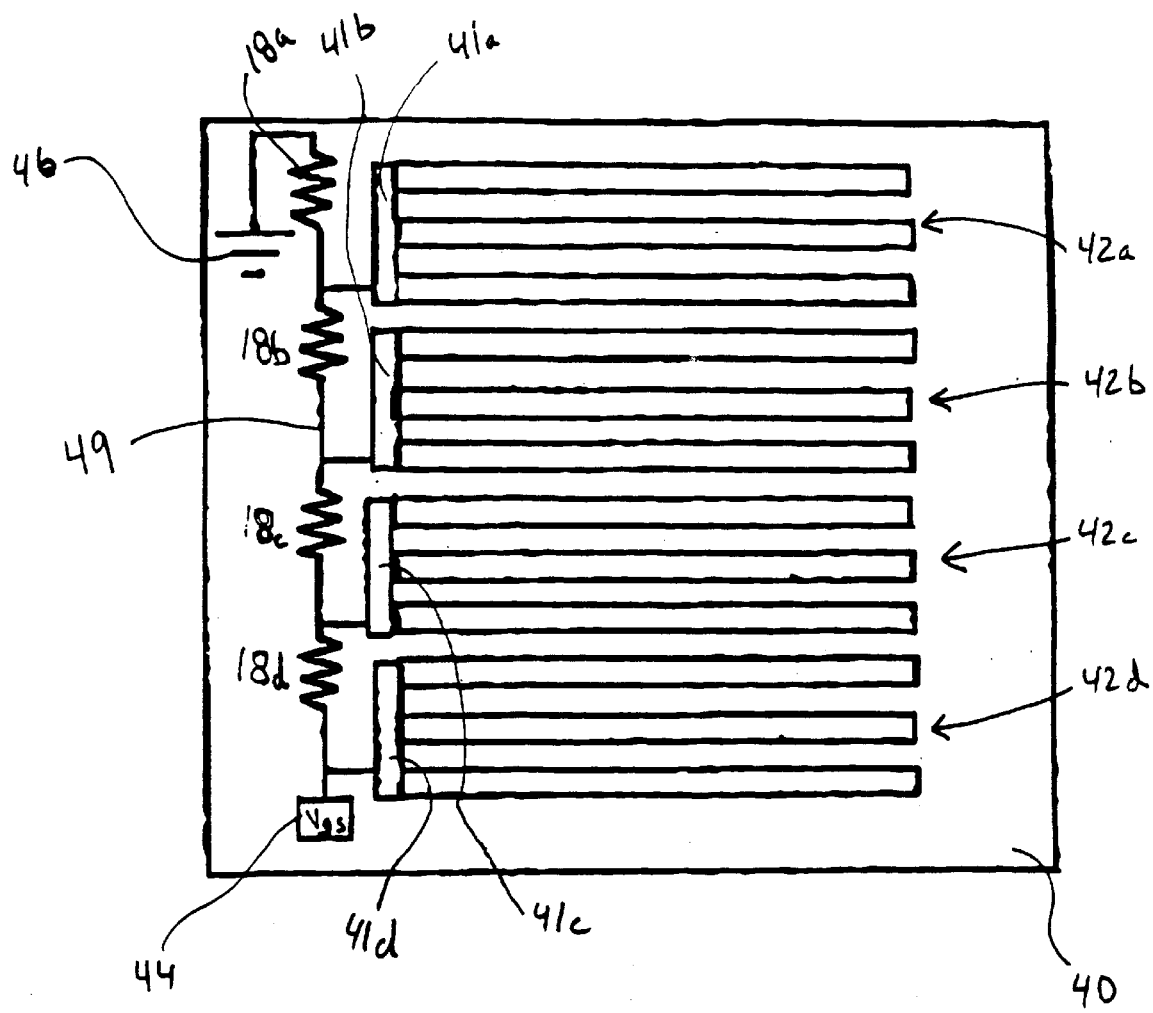
FIG. 2 is a schematic view of an on-chip implementation of a power transistor circuit, according to a further embodiment of the invention.

By way of further illustration, FIG. 2 shows a single chip embodiment of a power transistor package 38, according to one embodiment of the invention. In this embodiment, a semiconductor substrate 40 has disposed thereon a single power transistor formed by a plurality of transistor elements 42a–d. Forming the transistor elements on the same substrate will eliminate the problem of differing performance characteristics inherent in forming the transistor elements on separate substrates. To bias the transistor, i.e., elements 42a–d, a network of resistive elements 48a–d are provided between a terminal for receiving a bias voltage ("bias voltage terminal 44") and a reference ground terminal 46. As will be appreciated, the bias voltage terminal 44 may be a metallic lead frame extending from a top-side of the power package, or some other connector, as is known in the art. The reference ground terminal 46 may comprise a package mounting flange for coupling to a heat sink (e.g., in the case of an LDMOS power transistor) or a top-side lead frame (e.g., in the case of a Bi-Polar power transistor), or some other terminal connector, as also known in the art.

Each of the transistor elements 42a–d comprises multiple transistor fingers, which are connected at a respective gate terminal 41a–d for the respective transistor element 12a–d. The gate terminals 41a–d are, in turn, coupled in series to a conductive bias path 49 containing the resistive elements 48a–d, whereby a biasing circuit is formed between the bias voltage terminal 44 and the reference ground terminal 46. As with the transistor 10 in the embodiment of FIG. 1, the resistive elements 48a–d are interposed along the bias path 49 between connection points of successive transistor element gate terminals 41a–d, such that each gate terminal sees a different dividing resistor network because of the differing cumulative resistance values at the respective connection points.

In this embodiment, the resistive elements 48a–d can be implemented by various means. For example, chip or carbon film resistors may be used. Alternatively, a continuous resistive path may be disposed on the semiconductor substrate 40, coupled between the bias voltage terminal 44 and the reference ground terminal 46, and attached to the transistor elements 42a–d at their respective gate terminals 41a–d. Depending on the required biasing resistance, such a resistive path might comprise a conductive metal trace or a polysilicon material. These embodiments are described by way of example only, and it should be understood that any number of implementations of the resistive elements 48a–d can be used.

Notably, the invention can be applied to the design of monolithic microwave integrated circuits (MMIC) and on multi-layer PCB structures, where multiple LDMOS die are used in a single package to achieve the peak power levels, e.g., a few hundred watts needed for present day systems.

Figure 3:
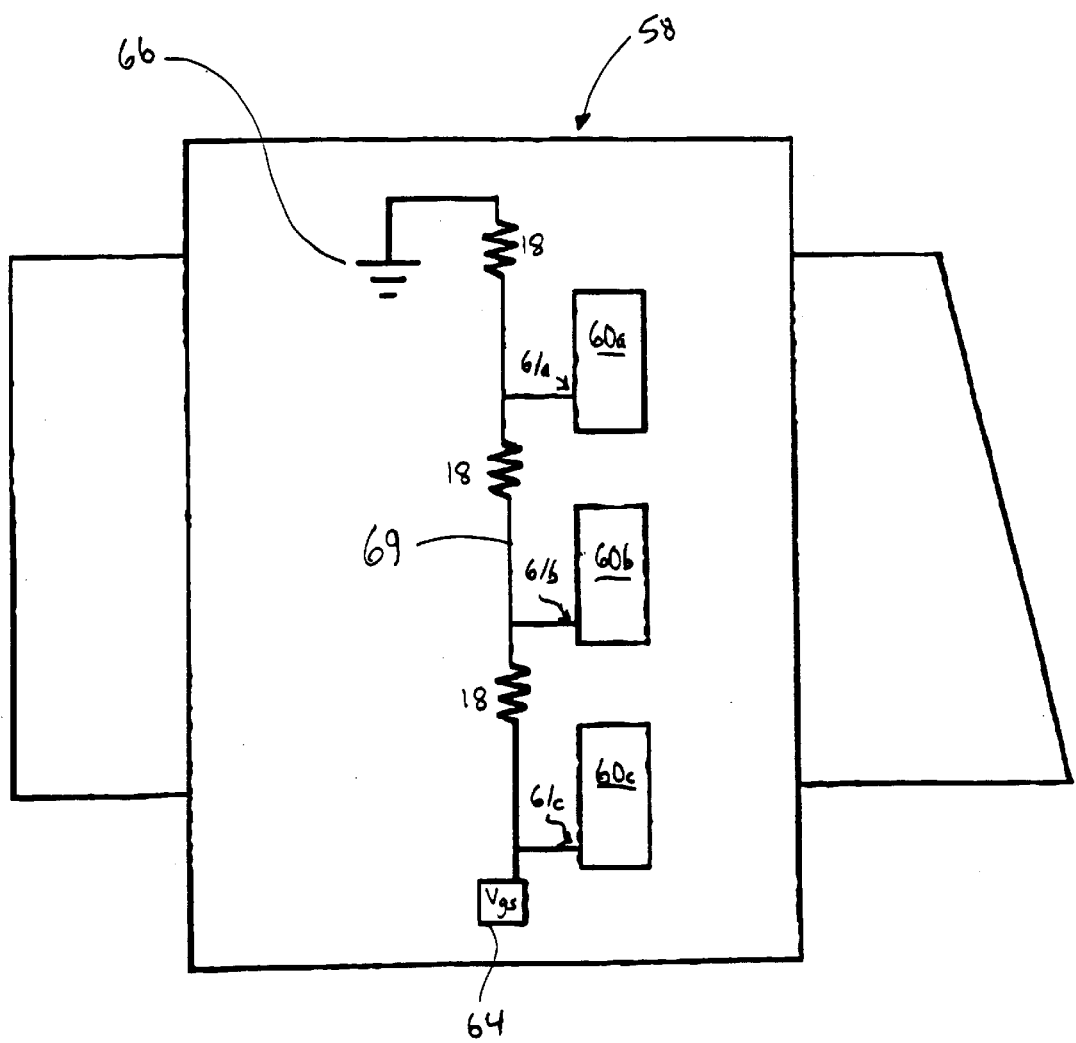
FIG. 3 is a schematic view of an embodiment of the invention implemented in a RF power package.

FIG. 3 depicts a further embodiment of the invention implemented inside a RF power package 58. In this embodiment, a single power transistor comprises individual sets or one or more transistor elements, each set formed on separate semiconductor die 60a–c, each transistor die having a common input (gate) terminal, 61a–c, respectively. The input terminals 61a–c are coupled to a conductive bias path 69 leading from a bias voltage terminal 64 to and a reference ground terminal 66, the bias path 69 including a plurality of resistive elements 68a–c. As described in connection with the embodiments of FIGS. 1 and 2, the resistive elements 68a–c are interposed in the bias path 69 between respective connection points of the gate terminals 61a–c. Because a different resistor divider network is thereby created for each transistor set (i.e., for each die 60a–c) on the input (gate) side of the power package 58, the individual transistor elements need not have high power handling capability, e.g., as in the case of a MOSFET, where there is very little gate current.

While preferred embodiments and applications have been shown and described, as can be appreciated by those of ordinary skill in the art, the invention can be embodied in other specific forms without departing from the inventive concepts contained herein. The presently disclosed embodiments, therefore, should be considered as illustrative, and not restrictive. Accordingly, the invention should not be limited except by the scope of the appended claims and their equivalents.

What is claimed:

1. A power transistor, comprising:
   a plurality of transistor elements, each transistor element having an input terminal connected to a conductive bias path, the bias path adapted for connection between a bias voltage and a reference ground; and
   a plurality of resistive elements disposed in the bias path, with at least one resistive element in the bias path between respective connection points of first and second transistor element input terminals, the resistive elements sized such that the first transistor element is biased in a first operating condition, and the second transistor element is biased in a second operating condition.

2. The power transistor of claim 1, wherein the first operating condition is class A, and the second operating condition is class AB.

3. The power transistor of claim 1, wherein a third transistor element is biased in a third operating condition.

4. The power transistor of claim 3, wherein the first operating condition is class A, the second operating condition is class AB, and the third operating condition is class B.

5. The power transistor of claim 1, wherein the first and second transistor elements are located on a single semiconductor substrate, and wherein a resistive element in the bias path between the respective connection points of the first and second transistor element input terminals is disposed on the substrate.

6. The power transistor of claim 1, wherein the first transistor element is located on a first semiconductor substrate, the second transistor element is located on a second semiconductor substrate, and wherein a resistive element in the bias path between the respective connection points of the first and second transistor element input terminals comprises a conductor extending between the first and second substrates.

7. A power transistor package, comprising:
   a bias voltage terminal;
   a reference ground terminal;
   a conductive bias path connecting the bias voltage terminal to the reference ground terminal;
   a plurality of resistive elements in the bias path; and
   a plurality of transistor elements, each transistor element comprising one or more individual field effect transistors coupled to a common gate terminal for the respective transistor element, the transistor element common gate terminals coupled to the bias path, with at least one resistive element in the bias path between respective connection points of first and second transistor element common gate terminals, the resistive elements sized so as to provide progressive biasing of the first and second transistor elements.

8. The power transistor package of claim 7, the resistive elements sized such that the first transistor element is biased in class A operating condition and the second transistor element is biased in class AB operating condition.

9. The power transistor package of claim 8, wherein a third transistor element is biased in class B operating condition.

10. The power transistor package of claim 7, wherein the first and second transistor elements are located on a single semiconductor substrate, and wherein a resistive element in the bias path between the respective connection points of the first and second transistor element gate terminals comprises a resistive path disposed on the substrate.

11. The power transistor circuit of claim 7, wherein the first transistor element is located on a first semiconductor substrate, the second transistor element is located on a second semiconductor substrate, and wherein a resistive element in the bias path between the respective connection points of the first and second transistor element gate terminals comprises a conductor extending between the first and second substrates.

12. A power transistor package, comprising:
    a first set of one or more transistor elements located on a first die, the first set of transistor elements coupled to a first input terminal;
    a second set of one or more transistors located on a second die, the second set of transistor elements coupled to a second input terminal; and
    a resistor network adapted for coupling the first and second input terminals between a bias voltage terminal and a reference ground terminal, the resistor network including at least one resistor coupled between the first and second input terminals, the resistor network configured such that the first set of transistor elements is biased in a first operating condition, and the second set of transistor elements is biased in a second operating condition.

13. The power transistor package of claim 12, wherein the first and second sets of transistor elements each comprise field effect transistors, the first input terminal comprising a common gate terminal for the first set of transistor elements, and the second input terminal comprising a common gate terminal for the second set of transistor elements.

14. The power transistor package of claim 12, wherein the first operating condition is class A, and the second operating condition is class AB.

* * * * *